United States Patent [19]

Hirano et al.

[11] Patent Number: 5,821,035
[45] Date of Patent: Oct. 13, 1998

[54] RESIST DEVELOPING APPARATUS AND RESIST DEVELOPING METHOD

[75] Inventors: Harunobu Hirano; Yasushi Kusano, both of Nagasaki; Rikio Ikeda; Ritsuko Inoue, both of Kanagawa, all of Japan

[73] Assignee: Sony Corporation, Tokyo, Japan

[21] Appl. No.: 811,261

[22] Filed: Mar. 4, 1997

[30] Foreign Application Priority Data

Mar. 6, 1996 [JP] Japan .................................... 8-078314
Mar. 12, 1996 [JP] Japan .................................... 8-083374

[51] Int. Cl.⁶ ....................................................... G03F 7/30
[52] U.S. Cl. ........................... 430/311; 430/313; 430/319
[58] Field of Search ..................... 430/311, 313, 430/319

[56] References Cited

U.S. PATENT DOCUMENTS

| 4,197,000 | 4/1980 | Blackwood | 354/323 |
| 4,215,192 | 7/1980 | Buckley | 430/270 |
| 4,457,259 | 7/1984 | Samuels | 118/705 |
| 4,564,280 | 1/1986 | Fukuda | 354/317 |
| 4,647,172 | 3/1987 | Batchelder et al. | 354/298 |
| 4,688,918 | 8/1987 | Suzuki et al. | 354/325 |
| 4,755,844 | 7/1988 | Tsuchiya et al. | 354/317 |
| 4,857,430 | 8/1989 | Millis et al. | 430/30 |
| 5,171,393 | 12/1992 | Moffat | 156/345 |
| 5,218,400 | 6/1993 | Kashiwagi et al. | 355/27 |
| 5,625,433 | 4/1997 | Inada et al. | 396/604 |

*Primary Examiner*—Hoa Van Lee
*Attorney, Agent, or Firm*—Hill & Simpson

[57] ABSTRACT

A developing apparatus used for developing a resist applied on a substrate, comprises: developer storage means for storing a developer; a developer supply tube for supplying the developer from the developer storage means through one end thereof onto a substrate supported in a position; and degas means located immediately upstream of the one end of the developer supply tube to deaerate the developer. A resist developing method comprises the steps of: supplying a substance; applying a resist onto the substrate; making a latest image in the resist; and supplying a developer onto the resist having the latest image to develop the resist, wherein the step of supplying the developer provides the developer in several times. Another resist developing method comprises the steps of: supplying a substrate; applying a resist onto the substrate; forming a latest image in the resist; providing a developer onto the resist having the latest image therein; after providing the developer, rotating the substrate and then stopping same; maintaining the substrate still; and rotating the substrate and then stopping same.

17 Claims, 10 Drawing Sheets a      b      c a      b      c a      b      c a      b      c a        b        c a        b        c a        b        c a        b        c a        b        c a        b        c

RESIST DEVELOPING APPARATUS AND RESIST DEVELOPING METHOD

BACKGROUND OF THE INVENTION

1. Field of the Invention

This invention relates to a resist developing apparatus and a resist developing method suitable for use in development of a resist in a manufacturing process of a semiconductor device.

2. Related Art

Along with a development of integration of LSIs, the design rule has been made strict, and a higher grade has been required both in performance of a resist and in method for developing the resist used in lithography in a LSI manufacturing process.

It is generally believed that a larger difference between the dissolution speed of an exposed portion and that of an unexposed portion of a resist during development, namely a higher dissolution contrast, is preferable to ensure a higher performance of the resist. This is because a higher dissolution contrast contributes to making a more rectangular cross-sectional shape of a resist pattern obtained by development, and a more rectangular cross-sectional shape of a resist pattern makes less pattern conversion error or variance during etching in the next step, i.e., an etching step using the resist pattern as a mask, and ensures a higher processing accuracy. Moreover, a higher dissolution contrast promises a higher resolution of the resist and makes it possible to form a more minute pattern.

Various improvements have been made to resist materials to realize a higher dissolution contrast. One of such improvements is to add a surface low solubility to a resist. This is the nature that the dissolution speed of an unexposed portion of a resist greatly decreases when contacting a developer. The surface low solubility of a resist has certainly contributed to a great improvement in resolution of the resist and in shape of a resist pattern obtained by development.

Improvements have been made also to the resist developing process in order to obtain more minute and accurate patterns. It is known that a developer is preferably less stirred to obtain higher resist resolutions and better cross-sectional shapes of resist patterns and that physical attack to a resist is preferably minimized to ensure uniform development.

Based on the knowledge, there have been developed and brought into practice some resist developing methods and their developer supply nozzles (hereinbelow often called developing nozzle) that were improved to decrease physical attack to a resist, can apply a developer on the resist more softly, and can form minute and accurate resist patterns. An example is explained with reference to FIGS. 1, 2 and 3. FIG. 1 is a plan view, FIG. 2 is a side elevational view, and FIG. 3 is an enlarged bottom view of the developing nozzle shown in FIGS. 1 and 2.

In the conventional resist developing method shown in FIGS. 1, 2 and 3, formed on a wafer 101 is an exposed resist (not shown) to be developed. Ad developing nozzle 102 having a length substantially equal to the diameter of the wafer 101 is located on a diameter of the wafer 101. While a developer is provided onto the wafer 101 from a number of developer spray holes formed in the bottom of the developing nozzle 102 in form of a dense single line, the wafer 101 is rotated by one half revolution. Thus, the developer is applied on the entire surface of the wafer 101 to develop the resist.

FIGS. 4 and 5 show another example of conventional resist developing methods that reduce physical attack to a resist. FIG. 4 is a plan view, and FIG. 5 is a side elevational view showing the distal end portion of the developing nozzle in an enlarged scale.

In the conventional resist developing method shown in FIGS. 4 and 5, a nozzle 202 is positioned just above the central portion of a wafer 201 on which an exposed resist (not shown) to be developed is applied. While the wafer 201 is rotated, a developer is provided onto the wafer 201 from five developer supply holes 203 formed in the distal end portion of the developing nozzle 202 as shown by arrows in FIGS. 4 and 5. Thus, the developer is applied to the entire surface of the wafer 201 to develop the resists.

The use of a high resolution resist having a high dissolution contrast and a resist developing method giving less physical attack to the resist certainly made it possible to fabricate high-integrated LSIs. Simultaneously, however, it caused a new problem, namely, generation of development defects such as under-development or non-developed portions of the resist.

The development defect is the phenomenon that several to tens of exposed portions of a resist are not removed to expose the wafer even after development of the resist by using a photo mask as a wafer.

This phenomenon is explained below in greater detail. As shown in FIG. 6A, when a resist 302 applied onto a wafer 301 is exposed by using a photo mask (not shown), a latent image 303 is formed in the resist 320. After that, when a developer 304 is sprayed onto the wafer 301 from a developing nozzle (not shown) to develop the resist 302 as shown in FIG. 6B, the resist 302 is selectively solved at portions of the latent image. In this process, the developer 304, once getting an increased pressure when exiting from the developing nozzle, returns to the atmospheric pressure after applied on the wafer 301. As a result, gases contained in the developer 304 make bubbles that exude from the developer 304 in form of so-called micro-bubbles 305. Once the micro-bubbles 305 extend over the portions of the latent image in the resist 302 to be removed, they prevent a sufficient amount of the developer to extend over the portions. As a result, these portions of the resist where contact holes 306a should be made remain unremoved as development defects 307 as shown in FIG. 6C.

When a high resolution resist having a high dissolution contrast is used, development defects 307 occur for the following reason. High resolution resists having a high dissolution contrast in general, have a high surface hydrophobic nature, and are liable to make a surface low soluble layer. Therefore, a developer cannot enter between the surface of the resist an d micro bubbles on the surface. This allows the micro bubbles to remain there for a long time, and causes development defects there.

When a resist developing method reducing physical attack to a resist is used, development defects 307 occur for the following reason. In such a resist developing method, reducing physical attack to a resist causes uneven distribution of the attacking strength on the wafer. As a result, micro bubbles cannot be removed from the surface of the resist, and development defects occur.

On the other hand, a surface activator is sometimes mixed in a resist for the purpose of preventing so-called striation, that is, radial, periodical unevenness in thickness of the resist. In this case, if the surface hydrophobic nature of the resist becomes excessively high due to affection by the surfactant, similar development defects occur.

Generation of micro bubbles has been acknowledged also when air is caught into a developer due to clashing of different streams of the developer while the developer is applied onto a wafer.

Since occurrence of development defects is a serious problem that inevitably decreases the yield of the LSI products, there is a strong demand for a technique that can make minute, accurate resist patterns and can prevent development defects.

OBJECT AND SUMMARY OF THE INVENTION

It is therefore an object of the invention to provide a resist developing apparatus and a resist developing method that can form minute and accurate resist patterns and can effectively prevent development defects.

A first point of the invention lies in suppression of development defects by deaerating a developer in a resist developing apparatus just before the developer is provided.

According to a first aspect of the invention, there is provided a developing apparatus used for developing a resist applied on a substrate, comprising: means for storing a developer; a developer supply tube for supplying the developer from the developer storage means through one end thereof onto a substrate supported in a position; and degas means located immediately upstream of the one end of the developer supply tube to deaerate the developer.

In the invention, the term "developer supply tube" envisages a developing nozzle arm and a developing nozzle.

The resist developing apparatus according to the first aspect of the invention can remove dissolved gases from the developer provided from the exit end of the developer supply tube, for example, by providing the degas means immediately upstream of the exit end of the developer supply tube. In this manner, the device can prevent generation of micro bubbles.

The resist developing apparatus may use a dissolved gas detector means located between the exit end of the developer supply tube and the degas means to detect the amount of dissolved air in the developer. In this case, the degas means degasses the developer just before it exits from the exit end of the developer supply tube, and the dissolved gas detector means detects the amount of dissolved gases in the developer. Therefore, the developer can be supplied after dissolved gases in the developer are reduced below a predetermined level. Thus, the device can prevent generation of micro bubbles.

At least a part of the developer supply tube immediately upstream of the exit end may be a tube containing a plurality of capillary tubes and capable of vacuum evacuation. In this case, dissolved gases are removed from the developer immediately before it exits from the exit end of the developer supply tube, and generation of micro bubbles can be prevented.

A second point of the invention is based on the following knowledge of the inventor on micro bubbles causing development defects. That is, the inventor has found that adhesion of micro bubbles onto the surface of a resist occurs when a developer is provided onto the substrate and that micro bubbles can be removed by providing an additional amount of a developer on the developer already applied onto the substrate.

Additionally, it has been found that rotating the substrate, especially at a high speed, and stopping the rotation immediately thereafter, and repeating the rotation and the stopping, if necessary, after the developer is provided onto the substrate, are also effective for removal of micro bubbles.

According to a second aspect of the invention, there is provided a resist developing method comprising the steps of: supplying a substrate; applying a resist on the substrate; making a latent image in the resist; and supplying a developer onto the resist having the latent image to develop the resist, in which the step of supplying the developer provides the developer in several different times.

According to a third aspect of the invention, there is provided a resist developing method comprising the steps of: supplying a substrate; applying a resist onto the substrate; forming a latent image in the resist; providing a developer onto the resist having the latent image; after providing the developer, rotating the substrate and then stopping it; maintaining the substrate still; and rotating the substrate and then stopping it.

Since the resist developing method according to the invention sprays the developer in several different times, micro bubbles adhering on the surface of the resist after the first spray of the developer can be effectively removed by the second and later sprays of the developer. Moreover, also when rotating and stopping motions of the substrate are repeated several times after the developer is once provided, micro bubbles adhering onto the surface of the resist by the first spray of the developer can be effectively removed due to the acceleration speed of rotation of the substrate.

The above and other objects and features of the present invention will become apparent from the following detailed description and the appended claims with reference to the accompanying drawings.

DETAILED DESCRIPTION OF THE PREFERRED EMBODIMENTS

Figure 1:
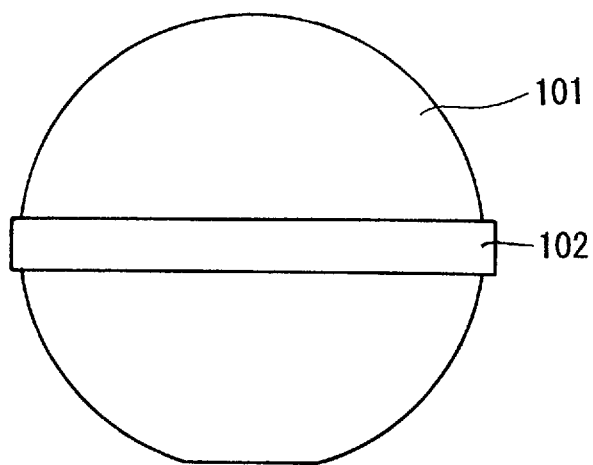
FIG. 1 is a plan view for explaining a conventional resist developing method.
Figure 2:
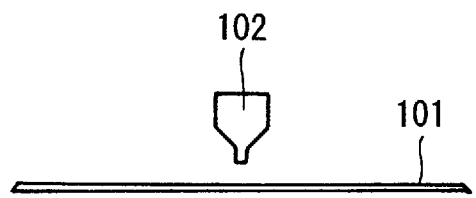
FIG. 2 is a side elevational for explaining the conventional resist developing method.
Figure 3:
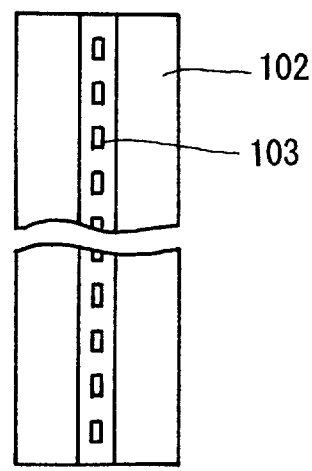
FIG. 3 is an enlarged bottom view for explaining the conventional resist developing method.

Explained below are first to fifth embodiments of the invention with reference to the drawings. In all figures of the embodiments, the same ow equivalent elements are labelled with common reference numerals.

Embodiment 1

Figure 7:
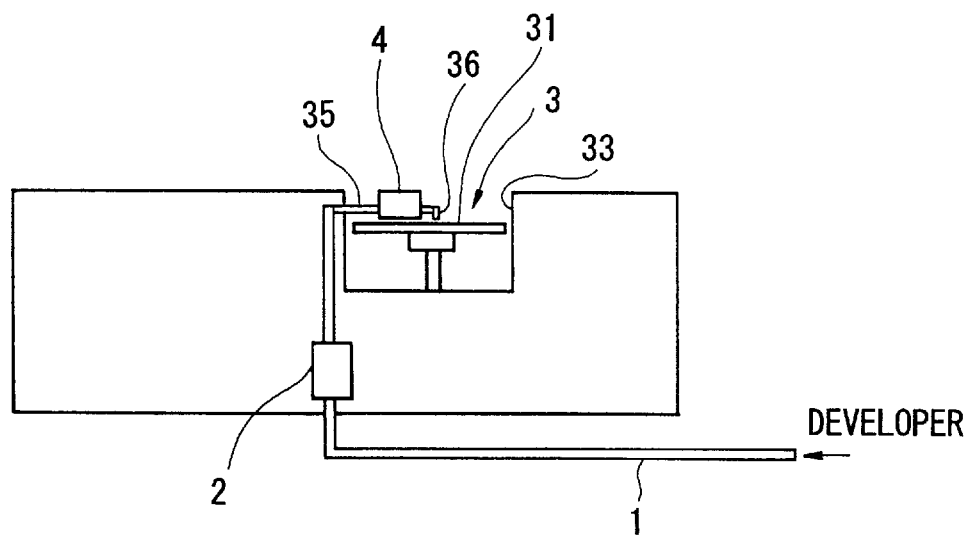
FIG. 7 is a side elevational view showing a general construction of a resist developing apparatus according to a first embodiment of the invention.
Figure 8:
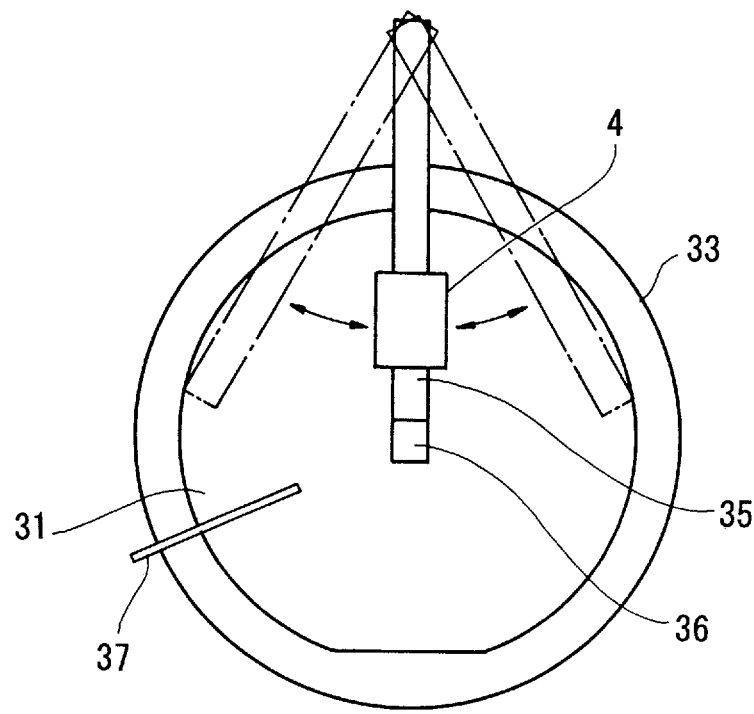
FIG. 8 is a plan view schematically showing a developing portion of the resist developing apparatus according to the first embodiment of the invention.
Figure 9:
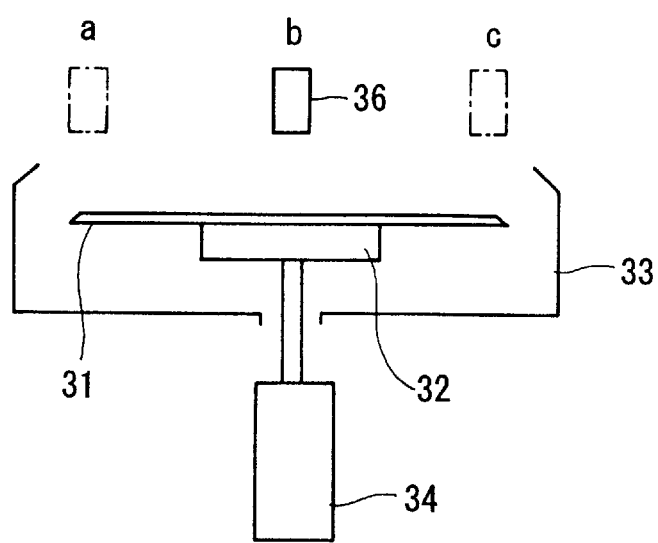
FIG. 9 is a cross-sectional view schematically showing the developing portion of the resist developing apparatus according to the first embodiment of the invention.

First explained is a resist developing apparatus taken as the first embodiment of the invention. FIG. 7 shows a general aspect of the resist developing apparatus, and FIGS. 8 and 9 show details of a developing portion of the resist developing apparatus. FIG. 7 is a side elevational view, FIG. 8 is a plan view, and FIG. 9 is a cross-sectional view.

As shown in FIG. 7, the resist developing apparatus according to the first embodiment includes a developer supply tube 1 connected to a separately prepared canister (metal container) or a factory pipe network (not shown) for a supply of a developer. The developer supply tube 1 is connected to a developing portion 3 via a filter 2.

Figure 4:
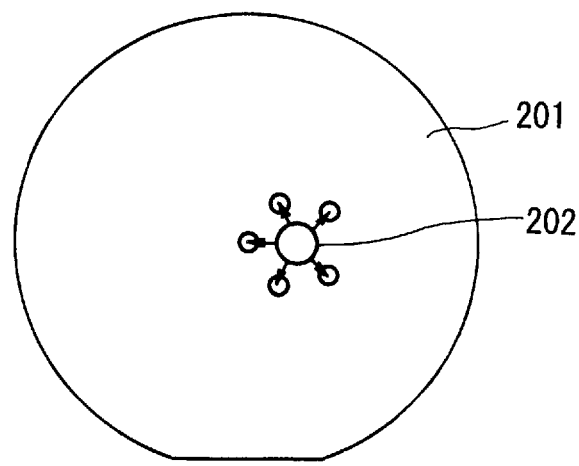
FIG. 4 is a plan view for explaining another conventional resist developing method.
Figure 5:
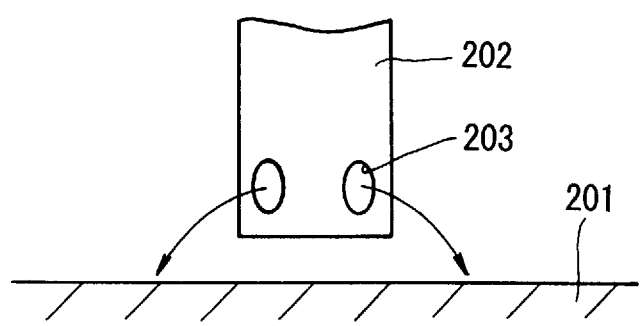
FIG. 5 is a side elevational view for explaining the another conventional resist developing method.
Figure 6A:
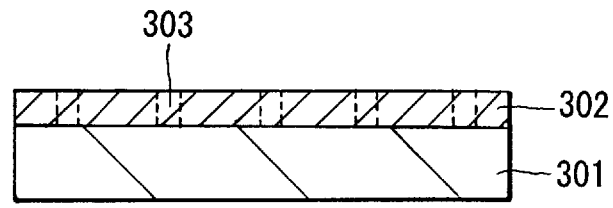
FIGS. 6A to 6C are cross sectional views for explaining development defects that occur when a resist is developed by the conventional resist developing method.
Figure 6B:
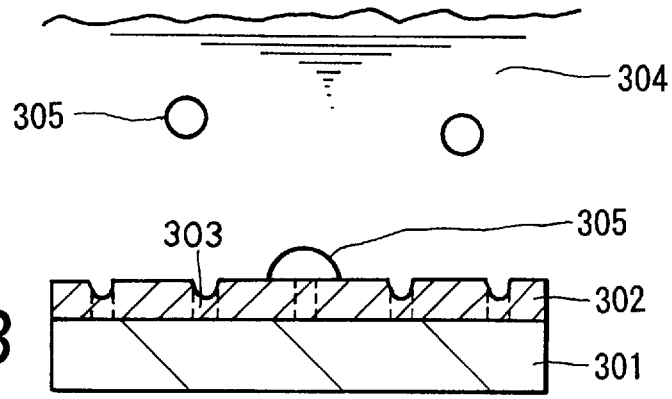
Figure 6C:
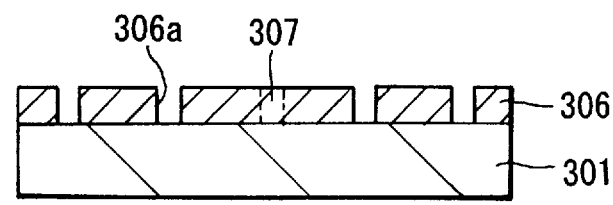

As shown in FIGS. 8 and 9, the developing portion includes a wafer chuck 32 within a developing cup 33 to support a wafer 31 having an exposed resist (not shown) to be developed. The wafer chuck 32 can be rotated about its center axis by a motor 34. Located above the wafer chuck 32 is a developing nozzle arm 35 that can rotate about its own proximal end within a plane parallel to the wafer 31 supported by the wafer chuck 32. The developing nozzle arm 35 has, at its distal end, a developing nozzle 36 for supplying a developer. The developing nozzle 36 used here is similar to the developing nozzle 202 shown in FIGS. 4 and 5, which has five developer supply holes at its distal end. The developing nozzle 36 us movable in radial directions of the wafer 31 by rotation of the developing nozzle arm 35. Apart from the developing nozzle 36, a rinse nozzle 37 for supplying pure water is provided such that it can be located on the wafer in replacement of the developing nozzle 36.

In the resist developing apparatus, the developer is supplied from the developer canister or from the factory piper network to the developer supply tube 1. In this case, a pressurized transport method using a nitrogen gas, for example, is used to supply the developer, which often causes the developer to contain the pressurizing gas together with oxygen.

To cope with the problem, the resist developing apparatus uses a deaerator unit 4 attached to the developing nozzle arm 35 to remove dissolved gases from the developer supplied from the developer supply tube 1. The interior of the deaerator unit 4 is evacuated into a low pressure around $8 \times 10^4$ Pa (600 mmHg), for example, to deaerate the developer.

In the resist developing apparatus having the above construction, the developer supplied from the developer supply tube 1 passes through the filter 2, where foreign matters are removed from the developer, then reaches the developing nozzle arm 35, and passes through the deaerator unit 4, where dissolved gases are removed from the developer. After the foreign matters and air are removed, the developer is provided onto the wafer 31 from the developing nozzle 36.

Among data of actual deaeration by the deaeration unit 4, when the amount of dissolved oxygen in the developer prior to deaeration was 7.5 mg/l, the dissolved oxygen was decreased to an approximately half value, 4.1 mg/l, in the developer after deaeration by the air removal unit 4. Although the developer also contains a considerable amount of dissolved nitrogen as explained before, the amount of dissolved oxygen in the developer can be used as an index of all dissolved gases in the developer.

According to the first embodiment described above, by using the deaeration unit 4 attached to the developing nozzle arm 35 to degas the developer, dissolved gases in the developer just before exiting from the developing nozzle 36 can be reduced significantly. As a result, generation of micro bubbles is alleviated, and development defects are decreased effectively. Accordingly, minute resist patterns can be made.

Embodiment 2

Next explained is a resist developing apparatus according to a second embodiment of the invention.

Figure 10:
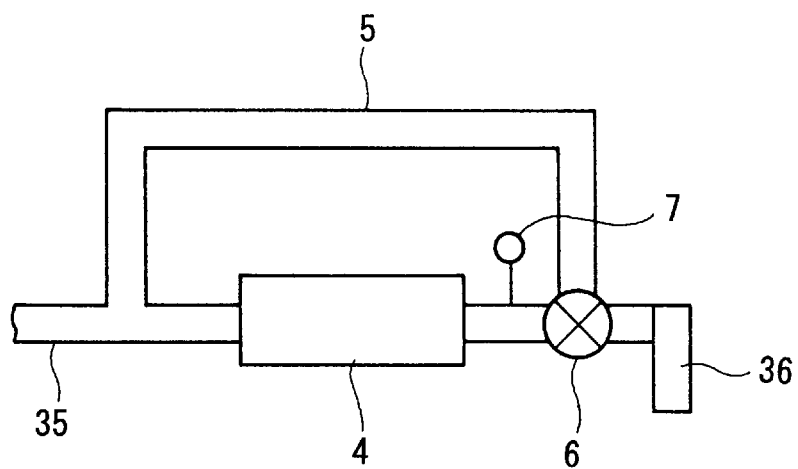
FIG. 10 is a side elevational view for explaining a resist developing apparatus according to a second embodiment of the invention.

As shown in FIG. 10, the resist developing apparatus according to the second embodiment includes a bypass pipe 5 that bypasses the deaeration unit 4. The bypass pipe 5 is connected to the developing nozzle arm 35 via a three-way valve 6 at one end of the bypass pipe 5. Attached to the developing nozzle arm 35 between the deaeration unit 4 and the three-way valve 6 is a dissolved oxygen detector 7 for detecting the amount of dissolved oxygen in the developer within the developing nozzle arm 35.

The other structural aspects of the resist developing apparatus according to the second embodiment are the same as the resist developing apparatus according to the first embodiment, and their explanation is omitted for avoiding redundancy.

In the resist developing apparatus according to the second embodiment, while the three-way valve 6 is switched to block the bypass pipe 5 by applying a control signal, the developer is sent to and degassed by the deaeration unit 4 to remove dissolved gases in the developer. In this process, the dissolved oxygen detector 7 measures the amount of dissolved oxygen in the developer at the exit of the deaeration unit 4. When the measured mount of dissolved oxygen is below a predetermined level, the developer is supplied to and provided from the developing nozzle 36. If the measured amount of dissolved oxygen in the developer exceeds the predetermined level, the three-way valve is switched by a control signal to open the bypass pipe 6 and shut the path from the deaeration unit 4 to the developing nozzle 36. Thus, the developer once passing through the deaeration unit 4 is returned to the entrance of the deaeration unit 4 for re-deaeration by the deaeration unit 4 to reduce the amount of dissolved gases. Deaeration of the developer is repeated until dissolved oxygen in the developer decreases to a predetermined value after passing through the deaeration unit 4. When dissolved oxygen decreases below the value, the developer is supplied to and sprayed from the developing nozzle 36.

According to the second embodiment described above, since the developer is sprayed from the developing nozzle 36 only after dissolved oxygen decreases below a predetermined value, generation of micro bubbles can be alleviated effectively, and development defects can be decreased effectively. Therefore, minute resist patterns can be made.

Embodiment 3

Next explained is a resist developing apparatus according to the third embodiment of the invention.

Figure 11:
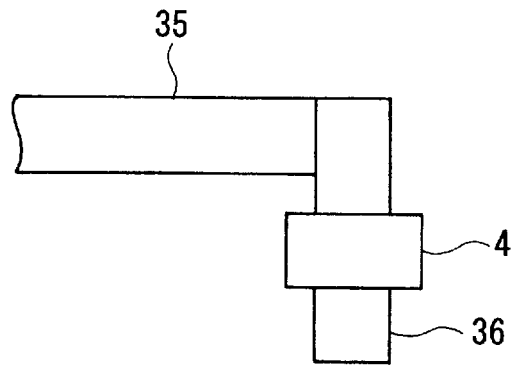
FIG. 11 is a side elevational view for explaining a resist developing apparatus according to a third embodiment of the invention.

As shown in FIG. 11, the resist developing apparatus according to the third embodiment locates the deaeration unit 4 within the length of the developing nozzle 36 and not within the length of the developing nozzle arm 35. Its other structural aspects are the same as the resist developing apparatus according to the first embodiment, and their explanation is omitted for avoiding redundancy.

According to the third embodiment, since the deaeration unit 4 is mounted within the length of the developing nozzle 36, dissolved gases in the developer can be removed immediately before the developer is provided from the developing nozzle 36. As a result, the same advantages as those of the first embodiment can be obtained.

Embodiment 4

Next explained is a resist developing apparatus according to the fourth embodiment of the invention.

Figure 12:
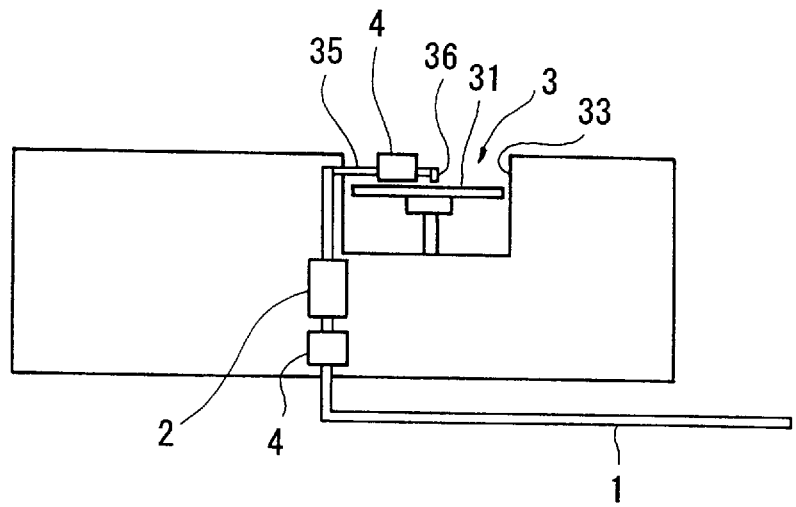
FIG. 12 is a side elevational view schematically showing a resist developing apparatus according to a fourth embodiment of the invention.

As shown in FIG. 12, the resist developing apparatus according to the fourth embodiment uses the deaeration unit 4 attached to the developing nozzle arm 35, and another deaeration unit 4 attached to the developer supply tube 1 immediately upstream of the filter 2. The device is the same as the resist developing apparatus according to the invention in other structural aspects, and their explanation is omitted for avoiding redundancy.

According to the fourth embodiment, since the developer is degassed not only by the deaeration unit attached to the developing nozzle arm 35 but also by the deaeration unit 4 located immediately upstream of the filter 2 in the developer supply tube 1, a larger amount of dissolved gases in the developer can be reduced. As a result, generation of micro bubbles can be alleviated effectively, development defects can be decreased effectively, and minute resist patterns can be made.

Embodiment 5

Next explained is a resist developing apparatus according to the fifth embodiment of the invention.

Figure 13:
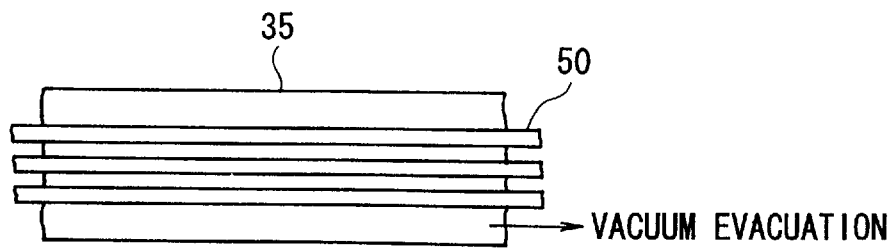
FIG. 13 is a cross-sectional view for explaining a resist developing apparatus according to a fifth embodiment of the invention.

As shown in FIG. 13, the developing nozzle arm 35 used in the resist developing apparatus according to the fifth embodiment is partly or entirely configured to contain a plurality of capillary tubes 50 aligned with gaps between them and capable of discharging gases through their walls. The interior of the tube is evacuated to degas the developer running through the capillary tubes 50. The other aspects of the device are the same as the resist developing apparatus according to the first embodiment, and their explanation is omitted here.

Also the fifth embodiment can remove dissolved gases from the developer immediately before it exits from the developing nozzle 36. As a result, the same advantages as those of the first embodiment can be obtained.

Next explained are methods for developing a resist by using the resist developing apparatuses according to the first to fifth embodiments described above.

In the following resist developing methods, the developing nozzle 36 is moved on the wafer 31 while spraying the developer from the developing nozzle 36 on the wafer 31 on which the resist is applied. There are four kinds of resist developing methods that are different in the way of movement of the developing nozzle 36.

In a resist developing method taken as a first example, while the developer is sprayed from the developing nozzle 36 onto a central portion of the wafer 31 under rotation, the developing nozzle 36 is moved on the wafer 31 along a path starting from the central point of the wafer 31, then passing a point on the circumferential edge of the wafer 31, and returning to a central point of the wafer 31.

Figure 14:
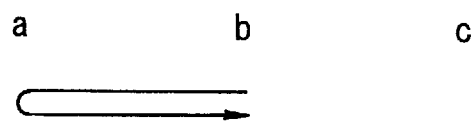
FIG. 14 is a schematic diagram showing a scanning pattern of a developing nozzle in a resist developing method.

In a typical mode of the resist developing method according to the first example, while the wafer 31 is rotated, the developing nozzle 36 is moved on the wafer 31 along a path starting from a central point of the wafer 31, then passing a point on the circumferential edge of the wafer 31, and returning to a central point of the wafer 31. In this case, the scanning pattern of the developing nozzle 36 is as shown in FIG. 14 where point a is a point on the circumferential edge of the wafer 31, point b is a central point of the wafer 31, and point c is a point on the circumferential edge of the wafer 31 opposite from the point a with respect to the center of the wafer (see FIG. 9).

Figure 15:
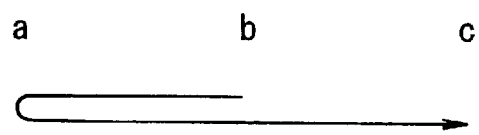
FIG. 15 is a schematic diagram showing a scanning pattern of a developing nozzle in a resist developing method.

Otherwise, the developing nozzle 36 may be moved on the wafer 31 along a path starting from a central point of the wafer 31, then passing a circumferential point and a central point of the wafer 31, and terminating at another circumferential point of the wafer 31 opposite from the former circumferential point with respect to the center of the wafer 31. In this case, the scanning pattern of the developing nozzle 36 is as shown in FIG. 15.

Figure 16:
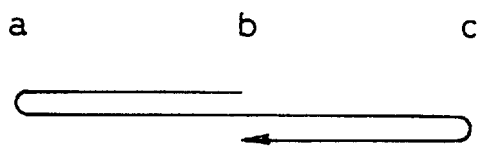
FIG. 16 is a schematic diagram showing a scanning pattern of a developing nozzle in a resist developing method.

The developing nozzle 36 may be moved on the wafer 31 along a path starting from a central point of the wafer 31, then passing a circumferential point and a central point of the wafer 31, further passing another circumferential point opposite from the former circumferential point with respect to the center of the wafer, and terminating at a central point of the wafer 31. In this case, the scanning pattern of the developing nozzle 36 is as shown in FIG. 16.

Figure 17:
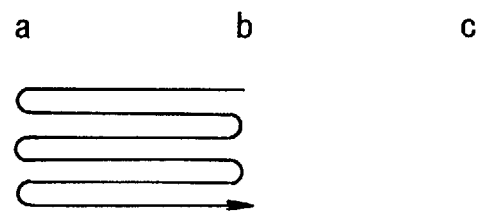
FIG. 17 is a schematic diagram showing a scanning pattern of a developing nozzle in a resist developing method.

The developing nozzle 36 may be moved to draw a scanning pattern combining two or more of the above-mentioned scanning patterns. It is also possible to move the developing nozzle 36 to repeat one or more of the scanning patterns shown above. The frequency of the repetition can be determined as desired. One example is to repeatedly move the developing nozzle 36 along a path starting from a central point of the wafer 31, passing a circumferential point of the wafer 31, and reaching a central point of the wafer 31. When the movement is repeated three times, the scanning pattern of the developing nozzle 36 is as shown in FIG. 17.

In the resist developing method according to the first example, the revolution of the wafer 31 is preferably reduced after the developing nozzle 36 sprays the developer onto a central portion of the wafer 31. More preferably, the revolution of the wafer 31 is further reduced after the developing nozzle 36 moves to a circumferential point of the wafer 31.

The moving speed of the developing nozzle 36 during movement from the circumferential point of the wafer 31 to a central point of the wafer 31 or to the opposite circumferential point with respect to the center of the wafer 31 is preferably slower than the moving speed of the developing nozzle 36 during movement from a central point of the wafer 31 to a circumferential point of the wafer 31.

When the developing nozzle 36 is repeatedly moved along a path starting from a central point of the wafer 31, passing a circumferential point of the wafer 31 and reaching a central point of the wafer 31, the moving speed of the developing nozzle 36 is preferably made fast during initial movements and slow during later movements from the viewpoint of improving uniformity of the development.

In a resist developing method taken as a second example, while the developer is sprayed from the developing nozzle 36 onto a circumferential portion of the wafer 31 under rotation, the developing nozzle 36 is moved on the wafer 31 along a path starting from the circumferential point of the wafer 31, then passing a central point of the wafer 31, and returning to the circumferential portion of the wafer 31.

Figure 18:
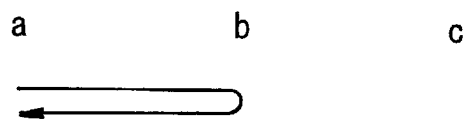
FIG. 18 is a schematic diagram showing a scanning pattern of a developing nozzle in a resist developing method.

In a typical mode of the resist developing method according to the second example, the developing nozzle 36 is moved on the wafer 31 along a path starting from a circumferential point of the wafer 31, then passing a central point of the wafer 31, and returning to the circumferential point. In this case, the scanning pattern of the developing nozzle 36 is as shown in FIG. 18.

The revolution of the wafer 31 is preferably reduced after the developer is sprayed onto the wafer 31 at the circumferential portion of the wafer 31. More preferably, the revolution of the wafer is further reduced after the developing nozzle 36 is moved to the central point of the wafer 31.

The moving speed of the developing nozzle 36 during movement from the circumferential point of the wafer 31 to a central point of the wafer 31 is preferably slower than the moving speed of the developing nozzle 36 during movement from a central point of the wafer 31 to a circumferential point of the wafer 31.

In the resist developing method taken as a third example, while the developer is sprayed from the developing nozzle 36 onto a circumferential portion of the wafer 31 under rotation, the developing nozzle 36 is moved on the wafer 31 along a path starting from the circumferential point of the wafer 31, then passing a central point of the wafer 31, and reaching another circumferential point opposite from the former circumferential point with respect to the center of the wafer 31.

Figure 19:
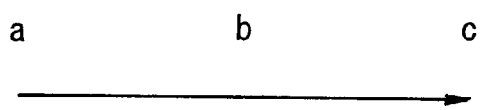
FIG. 19 is a schematic diagram showing a scanning pattern of a developing nozzle in a resist developing method.

In a typical mode of the resist developing method according to the third example, the developing nozzle 36 is moved on the wafer 31 along a path starting from a circumferential point of the wafer 31, then passing a central point of the wafer 31, and reaching another circumferential point opposite from the former circumferential point with respect to the center of the wafer 31.turning to the circumferential point. In this case, the scanning pattern of the developing nozzle 36 is as shown in FIG. 19.

Figure 20:
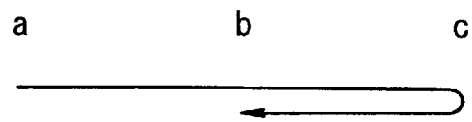
FIG. 20 is a schematic diagram showing a scanning pattern of a developing nozzle in a resist developing method.

Otherwise, the developing nozzle 36 may be moved on the wafer 31 along a path starting from a circumferential point of the wafer 31, then passing a central point of the wafer 31 and another circumferential point of the wafer 31 opposite from the former circumferential point with respect to the center of the wafer 31, and terminating at a central point of the wafer 31. In this case, the scanning pattern of the developing nozzle 36 is as shown in FIG. 20.

Figure 21:
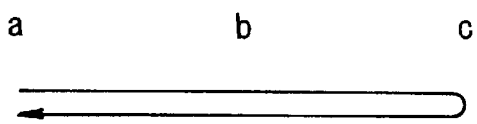
FIG. 21 is a schematic diagram showing a scanning pattern of a developing nozzle in a resist developing method.

The developing nozzle 36 may be moved on the wafer 31 along a path starting from a circumferential point of the wafer 31, then passing a central point of the wafer 31, another circumferential point of the wafer 31 opposite from the former circumferential point with respect to the center of the wafer 31 and a central point of the wafer 31 again, and returning to the former circumferential point of the wafer 31. In this case, the scanning pattern of the developing nozzle 36 is as shown in FIG. 21.

Figure 22:
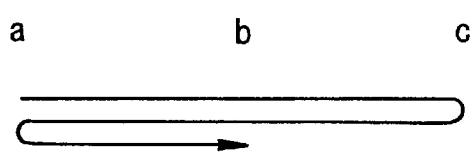
FIG. 22 is a schematic diagram showing a scanning pattern of a developing nozzle in a resist developing method.

The developing nozzle 36 may be moved on the wafer 31 along a path starting from a circumferential point of the wafer 31, then passing a central point of the wafer 31, another circumferential point of the wafer 31 opposite from the former circumferential point with respect to the center of the wafer 31, the central point of the wafer 31 once again, and the former circumferential point of the wafer 31 once again, and returning to the central point of the wafer 31. In this case, the scanning pattern of the developing nozzle 36 is as shown in FIG. 22.

Figure 23:
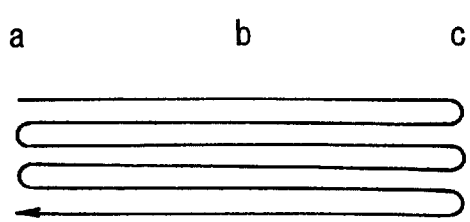
FIG. 23 is a schematic diagram showing a scanning pattern of a developing nozzle in a resist developing method.

In the resist developing method according to the third example, the developing nozzle 36 may be moved to draw a scanning pattern combining two or more of the above-mentioned scanning patterns. It is also possible to move the developing nozzle 36 to repeat one or more of the scanning patterns shown above. The frequency of the repetition can be determined as desired. One example is to repeatedly move the developing nozzle 36 along a path starting from a circumferential point of the wafer 31, passing a central point of the wafer 31, another circumferential point opposite from the former circumferential point of the wafer 31 with respect to the center of the wafer 31 and the central point once again, and returning to the former circumferential point of the wafer 31. In this case, the scanning pattern of the developing nozzle 36 is as shown in FIG. 23.

In the resist developing method according to the third example, the revolution of the wafer 31 is preferably reduced after the developing nozzle 36 sprays the developer onto the circumferential portion of the wafer 31. More preferably, the revolution of the wafer 31 is further reduced after the developing nozzle 36 moves to the opposite circumferential point of the wafer 31.

The moving speed of the developing nozzle 36 during movement from the latter circumferential point of the wafer 31 to the opposite circumferential point of the wafer 31 or to the former circumferential point with respect to the center of the wafer 31 is preferably slower than the moving speed of the developing nozzle 36 during movement from the former circumferential point to the latter circumferential point of the wafer 31.

When the developing nozzle 36 is repeatedly moved along a path starting from a circumferential point of the wafer 31, passing a central point, another circumferential point opposite from the former circumferential point with respect to the center of the wafer 31 and the central point of the wafer 31 once again, and reaching the former circumferential point of the wafer 31, the moving speed of the developing nozzle 36 is preferably made fast during initial scanning movements and slow during later scanning movements from the viewpoint of improving uniformity of the development.

In a resist developing method taken as a fourth example, while the developer is sprayed from the developing nozzle 36 onto a predetermined position of the wafer 31 under rotation, the developing nozzle 36 is moved on the wafer 31 to draw a spiral.

In the resist developing method according to the fourth example, the predetermined position of the wafer 31 is a central portion of the wafer 31 or a circumferential portion of the wafer 31.

In the resist developing methods taken as the first to fourth examples, since the developer is provided onto the wafer 31 from the developing nozzle 36 while it is moved on the wafer 31, physical attack by the developer is evened over the entire surface of the wafer 31, and micro bubbles sticking to the resist surface can be removed.

Although the development uniformity is liable to be degraded when the developer is sprayed onto the wafer 31 while the developing nozzle 36 is moved, the problem can be removed by adjusting the revolution of the wafer 31, scanning time, scanning speed, scanning width, initial position to spray the developer, terminal position to stop the spray of the developer, and so on, during movement of the developing nozzle 36 (during scanning by the developing nozzle 36).

Next explained are some practical examples of the resist developing method.

A resist developing method taken as a first practical example is explained below.

After the wafer 31 having an exposed resist (not shown) to be developed is set in the wafer chuck 32, the wafer chuck 32 is rotated by the motor 34 at the rate of 1000 rpm, for example.

After that, the developing nozzle arm 35 is moved to bring the developing nozzle 36 at one end thereof to a central point of the wafer 31 (point b in FIG. 9), and the developer (not shown) after removal of foreign matters and deaeration explained above is sprayed onto the wafer 31 from the developing nozzle 36.

Then, while the developer is provided, the developing nozzle 36 is started to move to a circumferential point of the wafer 31 (point a in FIG. 9) at the rate of 10 cm/sec, for example. Simultaneously, the revolution of the wafer 31 is reduced from 1000 rpm to 60 rpm, for example.

After that, while the developer is provided, the developing nozzle 36 is started to move to a central point of the wafer 31 (point b in FIG. 9) at the rate of 7 cm/sec, for example. Simultaneously, the revolution of the wafer 31 is reduced from 60 rpm to 30 rpm, for example.

In this case, the scanning pattern of the developing nozzle 36 is as shown in FIG. 14.

After the developer is applied on the entire surface of the wafer 31 in the above steps, the supply of the developer from the developing nozzle 36 is stopped, and the rotation of the wafer 31 is stopped.

After a period of time, the developing nozzle 36 is moved by the developing nozzle arm 35 to a position offset from the wafer 31. Instead, the rinse nozzle 37 is positioned above the wafer 31, and pure water is supplied from the rinse nozzle 37 onto the wafer 31 under rotation at the speed of 1000 rpm, for example, to stop the development.

After that, the supply of pure water from the rinse nozzle 37 is stopped, and the revolution of the wafer 31 is increased to 4000 rpm to centrifugally dewater the wafer 31. Then, the rotation of the wafer 31 is stopped.

Thus, the development process of the resist is completed.

As a result of the development of the resist, development defects of each wafer 31 were decreased to two from those as many as approximately 20 in the conventional method. The development uniformity obtained was ±0.02 $\mu$m for each contact hole having the diameter of 0.35 $\mu$m.

Figure 24:
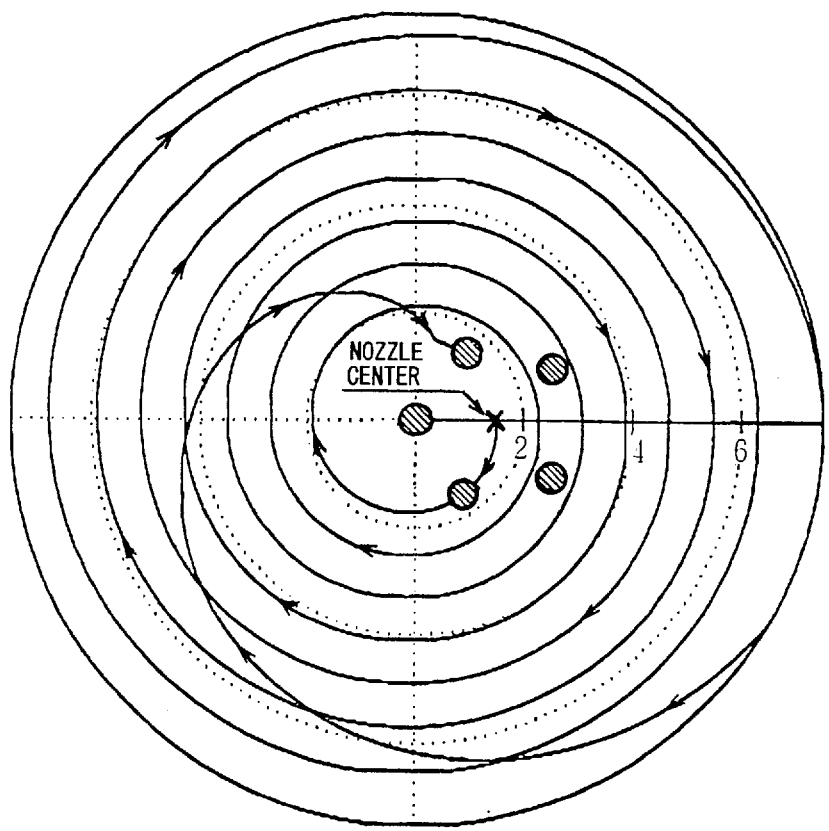
FIG. 24 is a schematic diagram showing a path drawn on a wafer by the center of a developing nozzle when the developing nozzle is moved on the wafer (scan the wafer) in the pattern shown in FIG. 14.

FIG. 24 shows a locus drawn on the wafer 31 by the center of the developing nozzle 36 when the developing nozzle 36 is moved on the wafer 31 in the pattern shown in FIG. 14 as explained with the resist developing method according to the first practical example. Here, the moving speed of the developing nozzle 36 during movement from a central point of the wafer 31 to a circumferential point was equal to the speed of the developing nozzle 36 during movement from the circumferential point of the wafer 31 to the central point (about 6.7 cm/sec). In FIG. 24, the hatched circle indicates landing points of the developer provided from five developer supply holes of the developing nozzle 36 onto the wafer 31. Numerals in FIG. 24 indicate distances from the center of the wafer 31 in cm. As understood from FIG. 24, the center of the developing nozzle 36 spirally moves from a central point to an outer circumferential point of the wafer 31, and then spirally moves back to the central point of the wafer 31.

Figure 25:
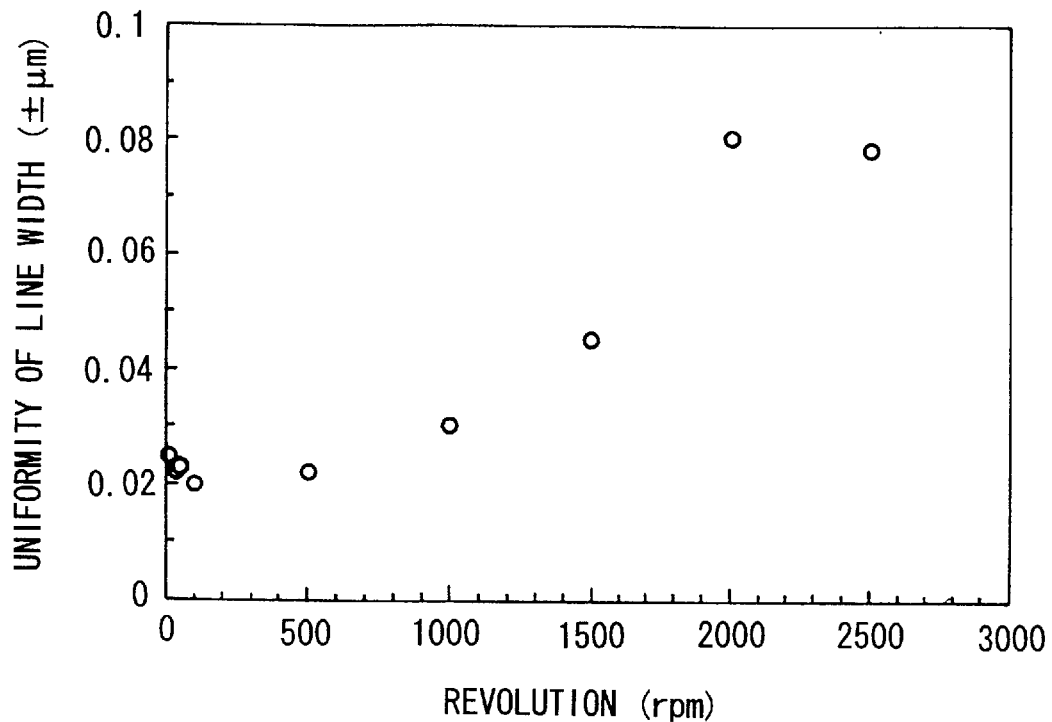
FIG. 25 is a schematic diagram showing the uniformity of the line width of the resist obtained by development which varies with the revolution of the wafer at the start of a spray of a developer from a developing nozzle when the developing nozzle is moved on the wafer (scan the wafer) in the pattern shown in FIG. 14.
Figure 26:
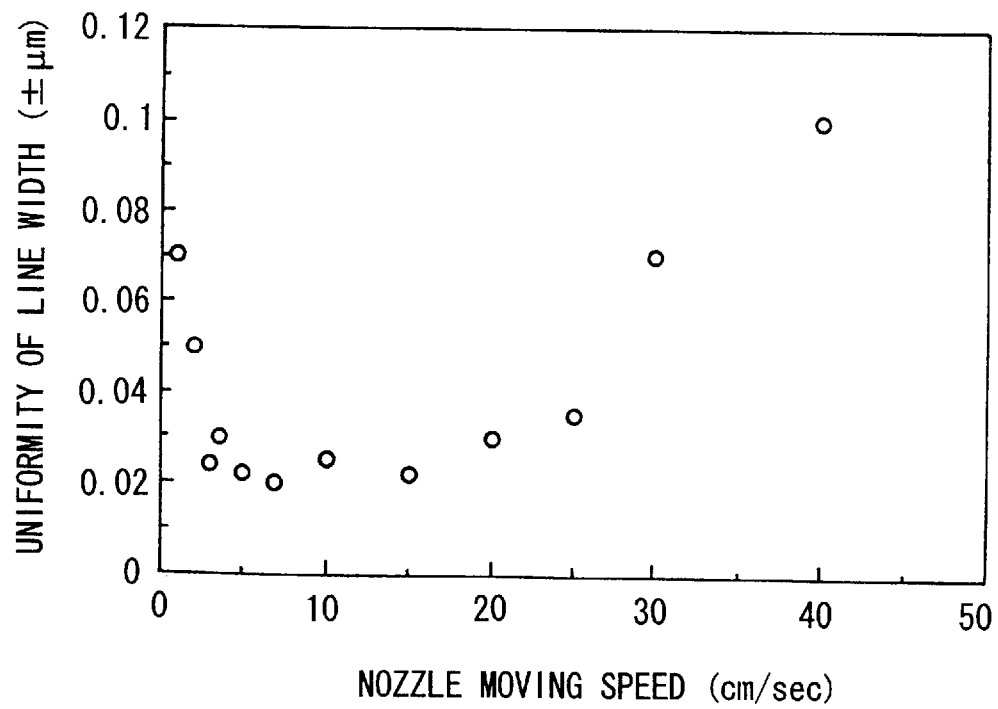
FIG. 26 is a schematic diagram showing the uniformity of the line width of a resist obtained by development which varies with the moving speed of the developing nozzle when the developing nozzle is moved on the wafer in the pattern shown in FIG. 14.

FIG. 25 shows the relation between the uniformity of the line width of the resist obtained by the development and the revolution of the wafer 31 at the start of spray of the developer from the developing nozzle 36 when the developing nozzle 36 is moved on the wafer 31 in the pattern shown in FIG. 14 as explained with the resist developing method according to the first practical example. FIG. 26 shows the relation between the moving speed of the developing nozzle 36 and the uniformity of the resist line width under the same conditions. In both FIG. 25 and FIG. 26, the moving speed of the developing nozzle 36 during movement from a central point to a circumferential point of the wafer 31 is equal to the moving speed of the developing nozzle during movement from the circumferential point to the central point of the wafer 31. It is known from FIG. 25 and FIG. 26 that, within a certain range, the uniformity of the line width becomes higher as the revolution of the wafer 31 is lower and as the moving speed of the developing nozzle 36 is faster.

Next explained is a resist developing method taken as a second practical example.

After the wafer 31 having an exposed resist (not shown) to be developed is set in the wafer chuck 32, the wafer chuck 32 is rotated by the motor 34 at the rate of 1000 rpm, for example.

After that, the developing nozzle arm 35 is moved to bring the developing nozzle 36 at one end thereof to a central point of the wafer 31 (point b in FIG. 9), and the developer after removal of foreign matters and deaeration explained above is sprayed onto the wafer 31 from the developing nozzle 36.

Then, while the developer is provided, the developing nozzle 36 is started to move to a circumferential point of the wafer 31 (point a in FIG. 9) at the rate of 10 cm/sec, for example. Simultaneously, the revolution of the wafer 31 is reduced from 1000 rpm to 60 rpm, for example.

After that, while the developer is provided, the developing nozzle 36 is started to move to a central point of the wafer 31 (point b in FIG. 9) at the rate of 7 cm/sec, for example. Simultaneously, the revolution of the wafer 31 is reduced from 60 rpm to 30 rpm, for example.

In this manner, the developing nozzle 36 is reciprocated three times between the central point (point b in FIG. 9) and the circumferential point (point a in FIG. 9) while spraying the developer. In this case, the scanning pattern of the developing nozzle 36 is as shown in FIG. 17.

After the developer is applied on the entire surface of the wafer 31 in the above steps, the supply of the developer from the developing nozzle 36 is stopped, and the rotation of the wafer 31 is stopped.

After a period of time, in the same manner as the first embodiment, pure water is supplied from the rinse nozzle 37 onto the wafer 31 rotated at the rate of 1000 rpm, for example, to stop the development.

After that, the supply of pure water from the rinse nozzle 37 is stopped, and the revolution of the wafer 31 is increased to 4000 rpm, for example, to centrifugally dewater the wafer 31. By stopping the rotation of the wafer 31 thereafter, the resist developing step is completed.

As a result of the development of the resist, development defects of each wafer 31 were decreased to two from those as many as approximately 20 in the conventional method. The development uniformity obtained was ±0.02 $\mu$m for each contact hole having the diameter of 0.35 $\mu$m.

Next explained is a resist developing method taken as a third practical example.

After the wafer 31 having an exposed resist (not shown) to be developed is set in the wafer chuck 32, the wafer chuck 32 is rotated by the motor 34 at the rate of 1000 rpm, for example.

After that, the developing nozzle arm 35 is moved to bring the developing nozzle 36 at one end thereof to a circumferential point of the wafer 31 (point a in FIG. 9), and the developer after removal of foreign matters and deaeration explained above is sprayed onto the wafer 31 from the developing nozzle 36.

Then, while the developer is provided, the developing nozzle 36 is started to move to a central point of the wafer 31 (point b in FIG. 9) at the rate of 10 cm/sec, for example. Simultaneously, the revolution of the wafer 31 is reduced from 1000 rpm to 60 rpm, for example.

After that, while the developer is provided, the developing nozzle 36 is moved to a circumferential point of the wafer 31 (point a in FIG. 9) at the rate of 7 cm/sec, for example. Simultaneously, the revolution of the wafer 31 is reduced from 60 rpm to 30 rpm, for example.

In this case, the scanning pattern of the developing nozzle is as shown in FIG. 18.

After the developer is applied on the entire surface of the wafer 31 in the above steps, the supply of the developer from the developing nozzle 36 is stopped, and the rotation of the wafer 31 is stopped.

After a period of time, in the same manner as the first embodiment, pure water is supplied from the rinse nozzle 37 onto the wafer 31 rotated at the rate of 1000 rpm, for example, to stop the development.

After that, the supply of pure water from the rinse nozzle 37 is stopped, and the revolution of the wafer 31 is increased to 4000 rpm, for example, to centrifugally dewater the wafer 31. By stopping the rotation of the wafer 31 thereafter, the resist developing step is completed.

As a result of the development of the resist, development defects of each wafer 31 were decreased to two from those as many as approximately 20 in the conventional method. The development uniformity obtained was ±0.02 $\mu$m for each contact hole having the diameter of 0.35 $\mu$m.

Next explained is a resist developing method taken as a fourth practical example.

After the wafer 31 having an exposed resist (not shown) to be developed is set in the wafer chuck 32, the wafer chuck 32 is rotated by the motor 34 at the rate of 1000 rpm, for example.

After that, the developing nozzle arm 35 is moved to bring the developing nozzle 36 at one end thereof to a circumferential point of the wafer 31 (point a in FIG. 9), and the developer after removal of foreign matters and deaeration explained above is sprayed onto the wafer 31 from the developing nozzle 36.

Then, while the developer is provided, the developing nozzle 36 is started to move through a central point of the wafer 31 (point b in FIG. 9) to the opposite circumferential point of the wafer 31 (point c in FIG. 9) at the rate of 10 cm/sec, for example. Simultaneously, the revolution of the wafer 31 is reduced from 1000 rpm to 30 rpm, for example.

In this case, the scanning pattern of the developing nozzle 36 is as shown in FIG. 19.

After the developer is applied on the entire surface of the wafer 31 in the above steps, the supply of the developer from the developing nozzle 36 is stopped, and the rotation of the wafer 31 is stopped.

After a period of time, in the same manner as the first embodiment, pure water is supplied from the rinse nozzle 37 onto the wafer 31 rotated at the rate of 1000 rpm, for example, to stop the development.

After that, the supply of pure water from the rinse nozzle 37 is stopped, and the revolution of the wafer 31 is increased to 4000 rpm, for example, to centrifugally dewater the wafer 31. By stopping the rotation of the wafer 31 thereafter, the resist developing step is completed.

As a result of the development of the resist, development defects of each wafer 31 were decreased to two from those as many as approximately 20 in the conventional method. The development uniformity obtained was ±0.02 $\mu$m for each contact hole having the diameter of 0.35 $\mu$m.

Next explained is a resist developing method taken as a fifth practical example.

After the wafer 31 having an exposed resist (not shown) to be developed is set in the wafer chuck 32, the wafer chuck 32 is rotated by the motor 34 at the rate of 1000 rpm, for example.

After that, the developing nozzle arm 35 is moved to bring the developing nozzle 36 at one end thereof to a circumferential point of the wafer 31 (point a in FIG. 9), and the developer after removal of foreign matters and deaeration explained above is sprayed onto the wafer 31 from the developing nozzle 36.

Then, while the developer is provided, the developing nozzle 36 is started to move through a central point of the wafer 31 (point b in FIG. 9) to the opposite circumferential point of the wafer 31 (point c in FIG. 9) at the rate of 10 cm/sec, for example. Simultaneously, the revolution of the wafer 31 is reduced from 1000 rpm to 60 rpm, for example.

After that, while the developer is provided, the developing nozzle 36 is moved through a central point of the wafer 31

(point b in FIG. 9) once again to the circumferential point of the wafer 31 (point a in FIG. 9) at the rate of 7 cm/sec, for example. Simultaneously, the revolution of the wafer 31 is reduced from 60 rpm to 30 rpm, for example.

In this case, the scanning pattern of the developing nozzle 36 is as shown in FIG. 21.

After the developer is applied on the entire surface of the wafer 31 in the above steps, the supply of the developer from the developing nozzle 36 is stopped, and the rotation of the wafer 31 is stopped.

After a period of time, in the same manner as the first embodiment, pure water is supplied from the rinse nozzle 37 onto the wafer 31 rotated at the rate of 1000 rpm, for example, to stop the development.

After that, the supply of pure water from the rinse nozzle 37 is stopped, and the revolution of the wafer 31 is increased to 4000 rpm, for example, to centrifugally dewater the wafer 31. By stopping the rotation of the wafer 31 thereafter, the resist developing step is completed.

As a result of the development of the resist, development defects of each wafer 31 were decreased to two from those as many as approximately 20 in the conventional method. The development uniformity obtained was ±0.02 µm for each contact hole having the diameter of 0.35 µm.

Next explained is a resist developing method taken as a sixth practical example.

After the wafer 31 having an exposed resist (not shown) to be developed is set in the wafer chuck 32, the wafer chuck 32 is rotated by the motor 34 at the rate of 1000 rpm, for example.

After that, the developing nozzle arm 35 is moved to bring the developing nozzle 36 at one end thereof to a circumferential point of the wafer 31 (point a in FIG. 9), and the developer after removal of foreign matters and deaeration explained above is sprayed onto the wafer 31 from the developing nozzle 36.

Then, while the developer is provided, the developing nozzle 36 is started to move through a central point of the wafer 31 (point b in FIG. 9) to the opposite circumferential point of the wafer 31 (point c in FIG. 9) at the rate of 10 cm/sec, for example. Simultaneously, the revolution of the wafer 31 is reduced from 1000 rpm to 60 rpm, for example.

After that, while the developer is provided, the developing nozzle 36 is moved once again to the circumferential point of the wafer 31 (point a in FIG. 9) at the rate of 7 cm/sec, for example. Simultaneously, the revolution of the wafer 31 is reduced from 60 rpm to 30 rpm, for example.

In this manner, the developing nozzle 36 is reciprocated three times between the circumferential point (point b in FIG. 9) and the opposite circumferential point (point c in FIG. 9) while spraying the developer.

In this case, the scanning pattern of the developing nozzle 36 is as shown in FIG. 23.

After the developer is applied on the entire surface of the wafer 31 in the above steps, the supply of the developer from the developing nozzle 36 is stopped, and the rotation of the wafer 31 is stopped.

After a period of time, in the same manner as the first embodiment, pure water is supplied from the rinse nozzle 37 onto the wafer 31 rotated at the rate of 1000 rpm, for example, to stop the development.

After that, the supply of pure water from the rinse nozzle 37 is stopped, and the revolution of the wafer 31 is increased to 4000 rpm, for example, to centrifugally dewater the wafer 31. By stopping the rotation of the wafer 31 thereafter, the resist developing step is completed.

As a result of the development of the resist, development defects of each wafer 31 were decreased to two from those as many as 20 in the conventional method. The development uniformity obtained was ±0.02 µm for each contact hole having the diameter of 0.35 µm.

In the fifth embodiment described before, the developer nozzle arm is partly or entirely formed as a tube containing a plurality of capillary tubes 50 capable of discharging air. Instead of it, a part or the entirety of the developing nozzle 36 or the developer supply tube 1 upstream of the developing nozzle arm 35, for example, may be a tube of this structure.

In some appropriate cases, another deaeration unit 4 may be provided also within the length of the developer supply tube 1 outside the device in the resist developing apparatuses according to the first to fifth embodiments.

Depending on conditions, the developing nozzle 36 moves to a position offset from the wafer 31 either at the start of scanning, during scanning, or at the end of scanning, in the resist developing methods according to the first to sixth practical examples.

Embodiment 6

Next explained is a resist developing method taken as a sixth embodiment of the invention.

The resist developing method according to the sixth embodiment uses the developing apparatus as shown in FIGS. 8 and 9, and effects development of a resist in the following process.

After the wafer 31 having an exposed resist (not shown) to be developed is set in the wafer chuck 32, the wafer chuck 32 is rotated by the motor 34 at the rate of 1000 rpm, for example.

After that, the developing nozzle arm 35 is moved to bring the developing nozzle 36 at one end thereof to a central point of the wafer 31 (point b in FIG. 9), and a first spray of the developer (not shown) is supplied from the developing nozzle 36 onto the wafer 31.

After the first spray of the developer, the spray of the developer is once stopped, and rotation of the wafer 31 is stopped.

A time later, while a second spray of the developer is supplied from the developing nozzle 36 near the central point of the wafer 31, the wafer is once again rotated at the rate of 1000 rpm, for example. Due to the second spray of the developer, micro bubbles (not shown) made on the surface of the resist on the wafer 31 upon the first spray of the developer are swept from the wafer 31. After that, the spray of the developer is stopped, and rotation of the wafer 31 is stopped.

A time later, the developing nozzle arm 35 is moved to bring the developing nozzle 36 offset from the wafer 31, and the rinse nozzle 37 is moved to take the position. Pure water is supplied from the rinse nozzle 37 onto the wafer 31, and the wafer 31 is rotated at the rate of 1000 rmp, for example, to stop the development.

After that, the supply of pure water from the rinse nozzle 37 is stopped, and the revolution of the wafer 31 is increased to 4000 rpm, for example, to centrifugally dewater the wafer 31. By stopping the rotation of the wafer 31 thereafter, the resist developing step is completed.

As a result of the development of the resist, development defects of each wafer 31 were decreased to one from those as many as approximately 10 in the conventional method. The development uniformity obtained was ±0.02 µm for each contact hole having the diameter of 0.35 µm.

As explained above, according to the sixth embodiment, since the developer is supplied onto the wafer 31 in two separate times, micro bubbles made on the surface of the resist on the wafer 31 upon the first spray of the developer can be effectively removed. As a result, development defects of the resist can be decreased effectively, and the yield of development can be improved. Beside this, minute resist patterns can be made.

Embodiment 7

Next explained is a resist developing method taken as a seventh embodiment of the invention.

The resist developing method according to the seventh embodiment uses the developing apparatus as shown in FIGS. 8 and 9, and effects development of a resist in the following process.

After the wafer 31 having an exposed resist (not shown) to be developed is set in the wafer chuck 32, the wafer chuck 32 is rotated by the motor 34 at the rate of 1000 rpm, for example.

After that, the developing nozzle arm 35 is moved to bring the developing nozzle 36 at one end thereof to a central point of the wafer 31 (point b in FIG. 9), and a first spray of the developer (not shown) is supplied from the developing nozzle 36 onto the wafer 31.

After the first spray of the developer, the spray of the developer is once stopped, and rotation of the wafer 31 is stopped.

A time later, while the wafer is once again rotated at the rate of 30 to 100 rpm, for example, a second spray of the developer is supplied from the developing nozzle 36 near the central point of the wafer 31 for 0.7 seconds, for example. Due to the second spray of the developer, micro bubbles (not shown) made on the surface of the resist on the wafer 31 upon the first spray of the developer are swept from the wafer 31. After that, the spray of the developer is stopped, and rotation of the wafer 31 is stopped.

A time later, the developing nozzle arm 35 is moved to bring the developing nozzle 36 offset from the wafer 31, and the rinse nozzle 37 is moved to take the position. Pure water is supplied from the rinse nozzle 37 onto the wafer 31, and the wafer 31 is rotated at the rate of 1000 rmp, for example, to stop the development.

After that, the supply of pure water from the rinse nozzle 37 is stopped, and the revolution of the wafer 31 is increased to 4000 rpm, for example, to centrifugally dewater the wafer 31. By stopping the rotation of the wafer 31 thereafter, the resist developing step is completed.

As a result of the development of the resist, development defects of each wafer 31 were decreased to one from those as many as 10 in the conventional method. The development uniformity obtained was ±0.02 µm for each contact hole having the diameter of 0.35 µm.

As explained above, according to the seventh embodiment like in the sixth embodiment, since the developer is supplied onto the wafer 31 in two separate times, micro bubbles made on the surface of the resist on the wafer 31 upon the first spray of the developer can be effectively removed. As a result, development defects of the resist can be decreased effectively, and the yield of development can be improved. Beside this, minute resist patterns can be made.

Embodiment 8

Next explained is a resist developing method taken as an eighth embodiment of the invention.

The resist developing method according to the eighth embodiment uses the developing apparatus as shown in FIGS. 8 and 9, and effects development of a resist in the following process.

After the wafer 31 having an exposed resist (not shown) to be developed is set in the wafer chuck 32, the wafer chuck 32 is rotated by the motor 34 at the rate of 1000 rpm, for example.

After that, the developing nozzle arm 35 is moved to bring the developing nozzle 36 at one end thereof to a central point of the wafer 31 (point b in FIG. 9), and a first spray of the developer (not shown) is supplied from the developing nozzle 36 onto the wafer 31.

After the first spray of the developer, the spray of the developer is once stopped.

After the revolution of the wafer 31 is reduced from 1000 rpm to 30 to 100 rpm, for example, a second spray of the developer is supplied from the developing nozzle 36 near the central point of the wafer 31 for 0.7 seconds, for example. Due to the second spray of the developer, micro bubbles (not shown) made on the surface of the resist on the wafer 31 upon the first spray of the developer are swept from the wafer 31. After that, the spray of the developer is stopped, and rotation of the wafer 31 is stopped.

A time later, the developing nozzle arm 35 is moved to bring the developing nozzle 36 offset from the wafer 31, and the rinse nozzle 37 is moved to take the position. Pure water is supplied from the rinse nozzle 37 onto the wafer 31, and the wafer 31 is rotated at the rate of 1000 rmp, for example, to stop the development.

After that, the supply of pure water from the rinse nozzle 37 is stopped, and the revolution of the wafer 31 is increased to 4000 rpm, for example, to centrifugally dewater the wafer 31. By stopping the rotation of the wafer 31 thereafter, the resist developing step is completed.

As a result of the development of the resist, development defects of each wafer 31 were decreased to one from those as many as approximately 10 in the conventional method. The development uniformity obtained was ±0.02 µm for each contact hole having the diameter of 0.35 µm.

As explained above, according to the eighth embodiment like in the sixth embodiment, since the developer is supplied onto the wafer 31 in two separate times, micro bubbles made on the surface of the resist on the wafer 31 upon the first spray of the developer can be effectively removed. As a result, development defects of the resist can be decreased effectively, and the yield of development can be improved. Beside this, minute resist patterns can be made.

Embodiment 9

Next explained is a resist developing method taken as a ninth embodiment of the invention.

The resist developing method according to the ninth embodiment uses the developing apparatus as shown in FIGS. 8 and 9, and effects development of a resist in the following process.

After the wafer 31 having an exposed resist (not shown) to be developed is set in the wafer chuck 32, the wafer chuck 32 is rotated by the motor 34 at the rate of 1000 rpm, for example.

After that, the developing nozzle arm 35 is moved to bring the developing nozzle 36 at one end thereof to a central point of the wafer 31 (point b in FIG. 9), and a spray of the developer (not shown) is supplied from the developing nozzle 36 onto the wafer 31.

After the developer is sprayed once, the spray of the developer is stopped, and rotation of the wafer 31 is stopped.

A given time later, the wafer 31 is once again rotated at the rate of 30 to 100 rpm, and is stopped immediately. The rotation and the stop of the rotation of the wafer 31 are repeated any necessary times in predetermined intervals. Due to this, micro bubbles (not shown) made on the wafer 31 upon the spray of the developer are removed from the wafer 31.

A time later, the developing nozzle arm 35 is moved to bring the developing nozzle 36 offset from the wafer 31, and the rinse nozzle 37 is moved to take the position. Pure water is supplied from the rinse nozzle 37 onto the wafer 31, and the wafer 31 is rotated at the rate of 1000 rmp, for example, to stop the development.

After that, the supply of pure water from the rinse nozzle 37 is stopped, and the revolution of the wafer 31 is increased to 4000 rpm, for example, to centrifugally dewater the wafer 31. By stopping the rotation of the wafer 31 thereafter, the resist developing step is completed.

As a result of the development of the resist, development defects of each wafer 31 were decreased to one from those as many as approximately 10 in the conventional method. The development uniformity obtained was ±0.02 μm for each contact hole having the diameter of 0.35 μm.

As explained above, according to the ninth embodiment, since the cycle of rotating and stopping the wafer 31 is repeated after the developer is sprayed once onto the wafer 31, micro bubbles made on the surface of the resist on the wafer 31 upon the supply of the developer can be effectively removed. As a result, development defects of the resist can be decreased effectively, and the yield of development can be improved. Beside this, minute resist patterns can be made.

Embodiment 10

Next explained is a resist developing method taken as a tenth embodiment of the invention.

The resist developing method according to the tenth embodiment uses the developing apparatus as shown in FIGS. 8 and 9, and effects development of a resist in the following process.

After the wafer 31 having an exposed resist (not shown) to be developed is set in the wafer chuck 32, the wafer chuck 32 is rotated by the motor 34 at the rate of 1000 rpm, for example.

After that, the developing nozzle arm 35 is moved to bring the developing nozzle 36 at one end thereof to a central point of the wafer 31 (point b in FIG. 9), and a spray of the developer (not shown) is supplied from the developing nozzle 36 onto the wafer 31.

After the developer is sprayed once, the spray of the developer is stopped, and rotation of the wafer 31 is stopped.

A given time later, the wafer 31 is once again rotated at the rate of 30 to 100 rpm. Acceleration of this rotation of the wafer 31 is set to 100 to 20000 rmp/min. Then, the rotation is stopped immediately. The high-accelerated rotation and stopping of the wafer are repeated several times in appropriate intervals. As a result, micro bubbles (not shown) made on the wafer 31 upon the spray of the developer are removed from the wafer 31.

A time later, the developing nozzle arm 35 is moved to bring the developing nozzle 36 offset from the wafer 31, and the rinse nozzle 37 is moved to take the position. Pure water is supplied from the rinse nozzle 37 onto the wafer 31, and the wafer 31 is rotated at the rate of 1000 rmp, for example, to stop the development.

After that, the supply of pure water from the rinse nozzle 37 is stopped, and the revolution of the wafer 31 is increased to 4000 rpm, for example, to centrifugally dewater the wafer 31. By stopping the rotation of the wafer 31 thereafter, the resist developing step is completed.

As a result of the development of the resist, development defects of each wafer 31 were decreased to one from those as many as approximately 10 in the conventional method. The development uniformity obtained was ±0.02 μm for each contact hole having the diameter of 0.35 μm.

As explained above, according to the tenth embodiment, since high-accelerated rotation and stopping of the wafer 31 are repeated after the developer is sprayed once onto the wafer 31, micro bubbles made on the surface of the resist on the wafer 31 upon the supply of the developer can be removed effectively. As a result, development defects of the resist can be decreased effectively, and the yield of development can be improved. Beside this, minute resist patterns can be made.

Having described specific preferred embodiments of the present invitation with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values indicated in the respective embodiments are only examples, and different values may be used.

Although the sixth to eighth embodiments have been explained as spraying the developer in two separate times, the supply of the developer may be done in three or more separate times.

Moreover, although the developing apparatus shown in FIGS. 8 and 9, which is used in the above methods, uses the developing nozzle 36 having five developer supply holes, less or more holes, or only hole, are acceptable.

What is claimed is:

1. A resist developing method for minimizing developer micro-bubble generation comprising the steps of:
   supplying a substrate;
   applying a resist onto said substrate;
   making a latent image in said resist;
   supplying a developer onto said resist having the latent image to develop said resist;
   maintaining said substrate without supplying said developer;
   supplying said developer onto said resist again; and
   removing said developer from on said resist.

2. The method according to claim 1 wherein said substrate is rotated at a rate between 30 to 100 rpm while said developer is sprayed again.

3. A resist developing method for minimizing developer micro-bubble generation, comprising the steps of:
   supplying a substrate;
   applying a resist onto said substrate;
   forming a latent image in the resist;
   providing a developer onto said resist having said latent image therein;
   after providing said developer, rotating said substrate and then stopping same;

maintaining said substrate still; and rotating said substrate and then stopping same without providing said developer.

4. The method according to claim 3 wherein the revolution of said substrate is between 10 to 60 rpm.

5. The method according to claim 3 wherein acceleration of said substrate during rotation is between 1000 to 2000 rpm/minutes.

6. A resist developing method for minimizing developer micro-bubble generation comprising, in the following order, the steps of:

supplying a substrate;

applying a resist onto said substrate;

making a latent image to said resist;

rotating said substrate after making the latent image in said resist;

supplying a developer onto said resist having the latent image to develop said resist during rotation of said substrate;

stopping rotating of said substrate and supplying said developer;

maintaining said substrate without rotating said substrate and supplying said developer;

rotating said substrate again;

supplying said developer onto said resist again;

stopping rotating said substrate and supplying said developer; and removing said developer from on said resist.

7. The method according to claim 6 wherein said rotation of said substrate is performed at a rate between 30 to 100 rpm while said developer is supplied during rotation.

8. A resist developing method for minimizing developer micro-bubble generation comprising the steps of:

supplying a substrate;

applying a resist onto said substrate;

making a latent image in said resist;

applying a developer onto said resist while moving said substrate relative to said nozzle in accordance with a first relative movement;

applying the developer onto said resist via the nozzle while moving said substrate relative to said nozzle in accordance with a second relative movement.

9. The resist developing method of claim 8 wherein said first relative movement comprises rotating said substrate on an axis and causing said nozzle to simultaneously traverse across said substrate.

10. The resist developing method of claim 8 wherein said first relative movement comprises varying a rate of rotation of said substrate as said nozzle traverses said substrate.

11. The resist developing method of claim 8 wherein said first relative movement comprises varying a rate of traversal of said nozzle as said nozzle traverses said substrate.

12. The resist developing method of claim 8 wherein said first relative movement comprises varying a rate of rotation of said substrate and a rate of traversal of said nozzle as said nozzle traverses said substrate.

13. The resist developing method of claim 8 wherein said first relative movement comprises traversing said substrate from a central portion of said substrate to a circumferential portion of said substrate.

14. The resist developing method of claim 8 wherein said first relative movement comprises traversing said substrate from a circumferential portion of said substrate to a central portion of said substrate.

15. The resist developing method of claim 11 wherein said first relative movement comprises reducing a relative rate of traversal of nozzle as said nozzle traverses said substrate.

16. The resist developing method of claim 11 wherein said first relative movement comprises reducing rotation of said substrate as said nozzle traverses said substrate.

17. The resist developing method of claim 8 wherein said second relative movement comprises rotating said substrate on the axis and causing said nozzle to transverse said substrate.

* * * * *